United States Patent [19]
Snaper et al.

[11] Patent Number: 5,254,237
[45] Date of Patent: Oct. 19, 1993

[54] PLASMA ARC APPARATUS FOR PRODUCING DIAMOND SEMICONDUCTOR DEVICES

[76] Inventors: Alvin A. Snaper, 2800 Cameo Cir., Las Vegas, Nev. 89107; Charles W. Benfield, 1000 W. Bonanza Rd., Las Vegas, Nev. 89106

[21] Appl. No.: 909,221

[22] Filed: Jul. 2, 1992

Related U.S. Application Data
[63] Continuation of Ser. No. 663,329, Mar. 1, 1991, abandoned.

[51] Int. Cl.$^5$ ............................................. C23C 14/32
[52] U.S. Cl. ...................... 204/298.41; 204/192.38; 427/580
[58] Field of Search ............... 204/192.38, 298.41; 427/37, 580

[56] References Cited

U.S. PATENT DOCUMENTS
| | | | |
|---|---|---|---|
| 4,645,895 | 2/1987 | Boxman et al. | 219/76.13 |
| 4,648,952 | 3/1987 | Savov et al. | 204/192.12 |
| 4,877,640 | 10/1989 | Muehlberger et al. | 427/34 |
| 5,013,578 | 5/1991 | Brown et al. | 427/37 |

*Primary Examiner*—Aaron Weisstuch
*Attorney, Agent, or Firm*—Donald D. Mon; David O'Reilly

[57] ABSTRACT

A diamond deposition system and process for producing diamond semiconductor devices. A multiple gun plasma arc deposition system allows controlled deposition of diamond-like materials on a substrate. Deposition is controlled by controlling the time duration of pulses to a main gun, an acceptor gun and donor gun in a vacuum chamber that may contain a small amount of hydrogen. The deposition process is also enhanced with microwave temperature control and substrate dithering with a transducer.

10 Claims, 4 Drawing Sheets

PLASMA ARC APPARATUS FOR PRODUCING DIAMOND SEMICONDUCTOR DEVICES

This application is a continuation of application Ser. No. 07/663,329, filed Mar. 1, 1991, now abandoned.

FIELD OF THE INVENTION

This invention relates to diamond deposition methods and apparatus and more particularly relates to the production of plasma arc controlled deposition for diamond semiconductors.

BACKGROUND OF THE INVENTION

The potential advantages of using diamond materials for many applications such as diamond semiconductors has spurred increasing research. Considerable research has gone into the problem of producing doped diamond devices because of this great potential. Most of the previous development work concentrated on chemical vapor deposition (CVD) with somewhat disappointing results.

Crystals of apparently pure and transparent, sp3, cubic carbon have been produced by arc deposition as a result of technology disclosed and taught by U.S. Pat. Nos. 3,625,848, Dec. 7, 1971; 3,836,451, Sep. 14, 1974; and U.S. Pat. No. 3,838,031; Sep. 24, 1974 issued to A.A. Snaper, a co-inventor of the method and apparatus disclosed herein. These patents relate to arc deposition processes and apparatus and deposition of ferroelectric material. A one millimeter (mm) laser-trimmed cube of clear, monocrystalline diamond has been produced that demonstrates that this accomplishment is feasible.

The proposed application of diamonds takes advantage of the unique properties of the crystallized carbon. These attributes include extreme hardness, durablity and unmatched ability to conduct heat and electricity. However, until the last decade or so these attributes could not be harnessed because commercial diamonds were only available from a costly process that produced diamonds as tiny clumps. Recently, however, investigators have discovered a variety of techniques for producing thin coatings of diamonds on substrates such as silicon, metals, ceramics, and even natural diamond. These new techniques have resulted in an industry wide race to be first to produce commercially valuable diamond-coated products.

These techniques have all shown the way for the development of diamond-based semiconductors. Diamonds having high thermal conductivity have a great ability to shed heat and thus diamond semiconductor chips could be positioned much closer together than their silicon based counterparts, and yet not overheat. This would allow for faster transport of electrons increasing operating speeds.

There are, however, formidable obstacles to the production of practical diamond semiconductors devices. First, semiconductors require a continuous single crystal of diamond, not separate little crystals (poly-crystalline films) that are grown with most current techniques. Further it is not easy to penetrate hard diamonds with dopants, the intentionally added impurities that make the material semiconductive. Dopants must be added during the deposition process. Conventional etching techniques used to create patterns on silicon wafers cannot be used with diamonds. Lastly, diamond films must be grown on substrates that are economical for large scale production. Continuing progress toward the production of practical diamond semiconductor devices is important because of the superior carrier mobility, thermal and photoconductivity, hardness, high temperature survivability and high voltage operating capability of doped diamond crystals which will permit an entirely new generation of useful electronic devices.

It is therefore one object of the present invention to provide a apparatus and method for producing diamond semiconductor devices.

Yet another object of the present invention is to provide an apparatus and method using plasma arc technology to produce diamond semiconductor devices.

Still another object of the present invention is to provide a method and apparatus for producing films of diamonds or "diamond-like" carbon-carbide of mostly cubic structure with precisely controlled doping.

Yet another object of the present invention is to provide a method and apparatus for depositing doped diamond in intricate patterns for integrated circuit devices such as those now being produced with silicon, germanium, gallium arsenide and other such materials.

BRIEF DESCRIPTION OF THE INVENTION

The purpose of the present invention is to provide a method and apparatus for producing diamond semiconductor devices comprised of films of diamonds of mostly cubic structure with precisely controlled doping.

Typically, semiconductors are comprised of heavily doped inlays on a substrate. For example, an insulated gate field effect transistor (IGFET) similar to those commonly found in the microstructure of integrated circuits have N-type heavily doped inlays on a P-type substrate. Source, gate and drain terminals are provided by conductive material deposited on an insulating layer which are connected to the heavily doped inlays. The present invention can produce such semiconductors using an arc deposition process which is advantageous because it can force mixing of otherwise immiscible substances to produce hitherto unknown alloys. This characteristic makes the arc deposition process ideally suited to laying down films of doped carbon crystals upon a doped substrate, and providing films of pure, cubical sp3 carbon for insulation, wherever desired.

In the process and apparatus of the present invention a main carbon beam is generated in a manner similar to that described in the above referenced patents of A.A. Snaper by provision of a pure carbon electrode in the main beam gun. Doping is provided by auxiliary beam guns having electrodes of acceptor and donor substances respectively. The system and method provides controlled deposition of carbon carbide diamond-like material on a substrate for diamond semiconductor devices. The separately controlled plasma-arc guns comprise a main gun, an acceptor gun, and a donor gun to control the deposition of material. The main gun generates a beam in a manner similar to that disclosed in the patents referred to hereinabove which are incorporated herein by reference. The main beam gun is provided with a pure carbon electrode. Doping is provided by the auxiliary beam donor and acceptor guns having donor and acceptor material electrodes respectively.

Since arc current cannot be easily controlled directly to control the amount of dopant employed in the mix, the exercise of such control of the arc deposition is by the time duration of pulses of direct current applied to the dopant guns. This may be accomplished electronically in several ways. The preferred method is to apply a preset count (representing a desired "on time" or pulse current duration) into a register. When starting or restarting the process, at each pulse of current to the dopant guns, the output from a clock oscillator is gated into a second register. The second register's count is repetitively compared to that in a preset register until a comparator shows a match of two counts, upon which a "stop" pulse is generated to cause a cut-off of arc current.

The cut-off pulses start gating "off" clock pulses in a fourth counter, which in turn is repetitively compared to the preset count in a third register which represents the desired "off-time". When a start comparator finds a match (zero difference) between the contents of the third and forth registers a pulse is initiated to restart the cycle.

The sequence of events for a particular arc gun is as follows:

1. Strike an arc.
2. Apply arc current to the electrode gun.
3. Start count from clock oscillator simultaneously with application of arc current.
4. Compare clock count with the count preset in a register.
5. Generate a pulse to turn off the direct current to an electrode gun when clock count and the count in a preset register match.
6. Begin counting with a fourth register.
7. Compare pre-set "off-time" pulse stored in a third register against count stored in the fourth register counting clock pulses from a clock oscillator.
8. Generate a pulse to signal a restart when the start comparator detects a match between the preset "off-time" pulse in the third register and the number of counts in the fourth register to restart the cycle and again ignite the arc.

The diamond semiconductor system produces a series of precisely timed easily controlled pulses of current which produce a series of pulses of dopant plasma directed toward a workpiece (i.e. substrate on a holder). The control is limited by the time required to strike an arc for each pulse at the high pulse rate end. External computer control is possible because of numerical control of doping by storing desired counts into controlling registers.

An alternative doping means, that is less restricted at the high pulse rate end of the control range, uses an accelerated ion beam of the desired doped ions to embed the dopant atoms in the surface of the diamond layer. Since high energy beams are required because of the intrinsic hardness of the diamond layer, an ion beam accelerator may be, under some conditions, substituted for one or more of the plasma arc guns described hereinabove.

Diamond coatings on silicon have been used previously to replace traditional "silicon on sapphire" (SOS) chip configurations. In the latter process, silicon is usually coated onto the sapphire. In a diamond coating process the diamond is coated onto the silicon; the chip is then turned over so that the diamond serves as a substrate. Similarly, diamond on copper, gold or similar metallic conductive materials can be produced as a wafer. When used as a wafer a photomask is applied to the gold, copper or other metal surface to permit etching or electron beam machining of complicated conductive patterns into the metal coating leaving, in effect, microscopic metallic conductive traces on the diamond surface. This method is particularly useful for producing complicated semiconductor devices, such as gate arrays, memory chips, and microprocessor chips.

Because diamond material generally does not adhere well to other materials the application of conductive traces is difficult. For such applications, it is advantageous to apply an extremely thin layer of pure, amorphous carbon (C12) or pyrolytic graphite from an ion beam accelerator through a photomask-etched pattern. The extremely thin layer of pure carbon serves as a sort of cement or "stitch" to secure the metal to the diamond, because the carbon is embedded in the diamond surface slightly by the impact energy of the ion beam. Normally, graphite is considered as a lubricant but in very thin films its behavior is somewhat different because crosslinks form with those carbon atoms that are embedded in the surface of the diamond crystal.

The plane of preferred thermal conductivity of a pyrolitic graphite layer is controlled by biasing the target with a fixed (or changeable under computer control) direct, biased voltage. This permits the thermal conductivity of the pyrolitic graphite layer to be optimized for best heat dissipation.

With auxiliary plasma arc guns used to inject the dopant, smoother distribution and a more even flow into the diamond surface is obtained by dithering from the substrate holder at sonic or ultrasonic frequencies. A barium titanate slab or similar transducer driven by a power oscillator performs the mechanical dithering of the substrate and holder.

There are numerous variations possible for the design of the electronic control circuit to perform the cycling of the dopant arc. The end result is that the dopant is being poured into the film at some rate slower than the buildup of the main crystal. The percentage of doping of the resulting film can be controlled by varying the ratio of these rates.

As a practical matter, only one doping gun is used at a time for most applications. Further the buildup of layers of the film to produce integrated circuits requires power-down and opening of the vacuum chamber in order to change mass and plasma guns and clean the viewing windows, etc. For deposition of the metal conductors that permit connection of the diamond clip to external circuitry, arc guns of nearly pure metal are utilized.

The cutting, slicing, etching of the wafer can be accomplished by currently used techniques of laser trimming and/or electron beam machining performed on the chip in the same vacuum chamber by means well known in the semiconductor art.

An important factor to producing the proper crystallization of carbon on a substrate is the temperature of the substrate. In the present invention the temperature of the substrate can be controlled by applying microwave beam energy directly to the target substrate holder. The temperature of the substrate can be controlled by a temperature sensor placed on the back of the substrate holder that detects the temperature and relays information to a temperature control electronics package. This package compares the temperature to a manually preset value and issues appropriate turn on/turn off and power level switching orders to the microwave energy beam source that illuminates the target. This closes the loop to provide precise temperature control of the substrate. It has been found that a substrate temperature in the range of 750–800 degrees Fahrenheit produces proper crystallization of sp3 carbon.

Another important factor for controlling the crystal deposition mode is the presence of a small amount of hydrogen in the chamber. Hydrogen does not appear to enter into the crystal, itself, but acts as a sort of catalyst to help bring about the formation of the sp3 mode crystals rather than an sp2 format. The partial pressure of the hydrogen is kept sufficiently low enough so that the chamber is still practically a vacuum. Obviously, when depositing graphite (or amorphous carbon layers), for bonding, the hydrogen is first removed from the vacuum.

Some previous processes have relied upon methane as a source of carbon in chemical vapor deposition (CVD) in a way that has both hydrogen and carbon present in the chamber. By contrast, since carbon ions are bound in the arc deposition process, pure hydrogen is preferred as an ambient atmosphere in the chamber, for most operations.

The above and other advantages and novel features of the invention will become more fully understood from the following detailed description and accompanying drawings in which:

DETAILED DESCRIPTION OF THE INVENTION

Figure 1:
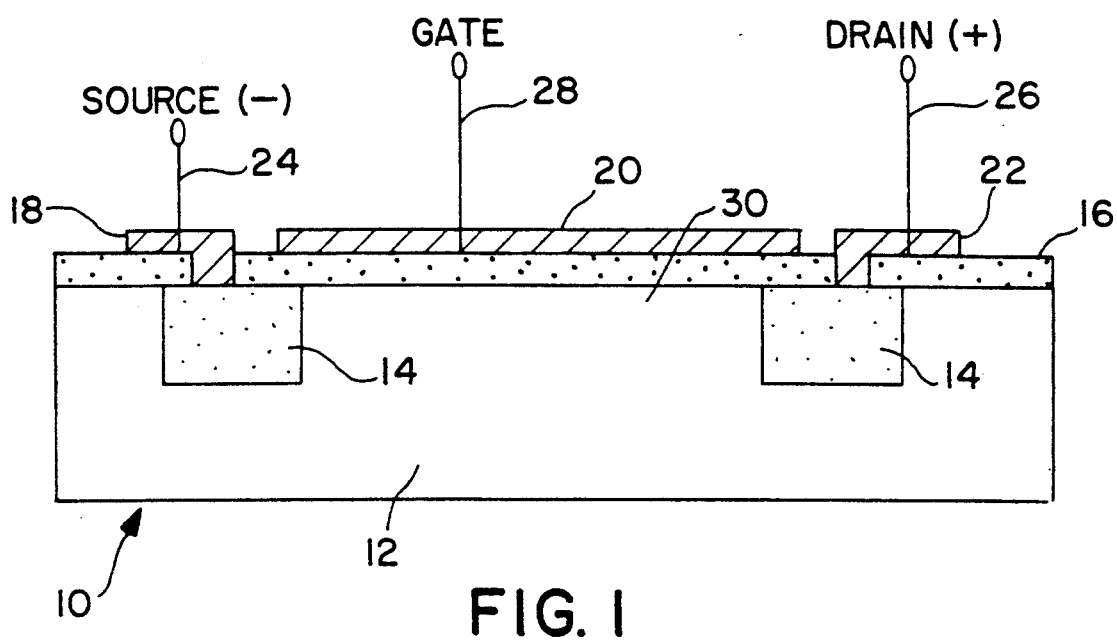
FIG. 1 is a cross section of a typical N-channel enhancement mode insulated gate field effect transistor (IGFET).

A typical semiconductor device shown in cross section is illustrated in FIG. 1. The device illustrated is an n-channel enhancement mode insulated gate field transistor (IGFET). This transistor is similar to those commonly found in the microstructure of an integrated circuit (IC). However this device is fabricated from cubical carbon instead of cubical silicon. This device has a p-type carbon carbide substrate 12 lightly doped with a trivalent material such as boron, gallium, indium, thallium or aluminum and n-type inlays 14 heavily doped with a donor material (pentavalent) such as arsenic, phosphorous, antimony, bismuth, or nitrogen. Upper layer 16 is an undoped diamond like carbon carbide or silicon dioxide insulator layer. Terminals are provided by metallic conductive materials at 18, 20 and 22 made of such material as gold, silver, copper or tin. Connections to metallic layers 18 and 20 provide source 24 and drain 26 terminals respectively. Metallic layer 20 provides a gate terminal 28. With a source/drain potential connected as shown at terminals 24 and 26 and applied to the gate metallic layer terminal 28 the semiconductor device acts like an extremely high resistance. When a voltage that is positive with respect to the source 24 is applied to the gate 28 the excess "holes" (unfilled valance) in the substrate 12 are repelled away from the gate area 30 and electrons are attracted toward this area, providing a conductive channel between source terminal 24 and drain terminal 26 permitting conduction at a very low resistance. This action is rapid enough to permit switching and linear amplification to occur in the very high frequency part of the radio spectrum as well as at sub-audio frequencies. Many other semiconductor configurations are possible with this same general approach. The insulated gate FET shown in FIG. 1 has merely been chosen as an example of one typical active element among many on an integrated circuit chip.

Figure 2:
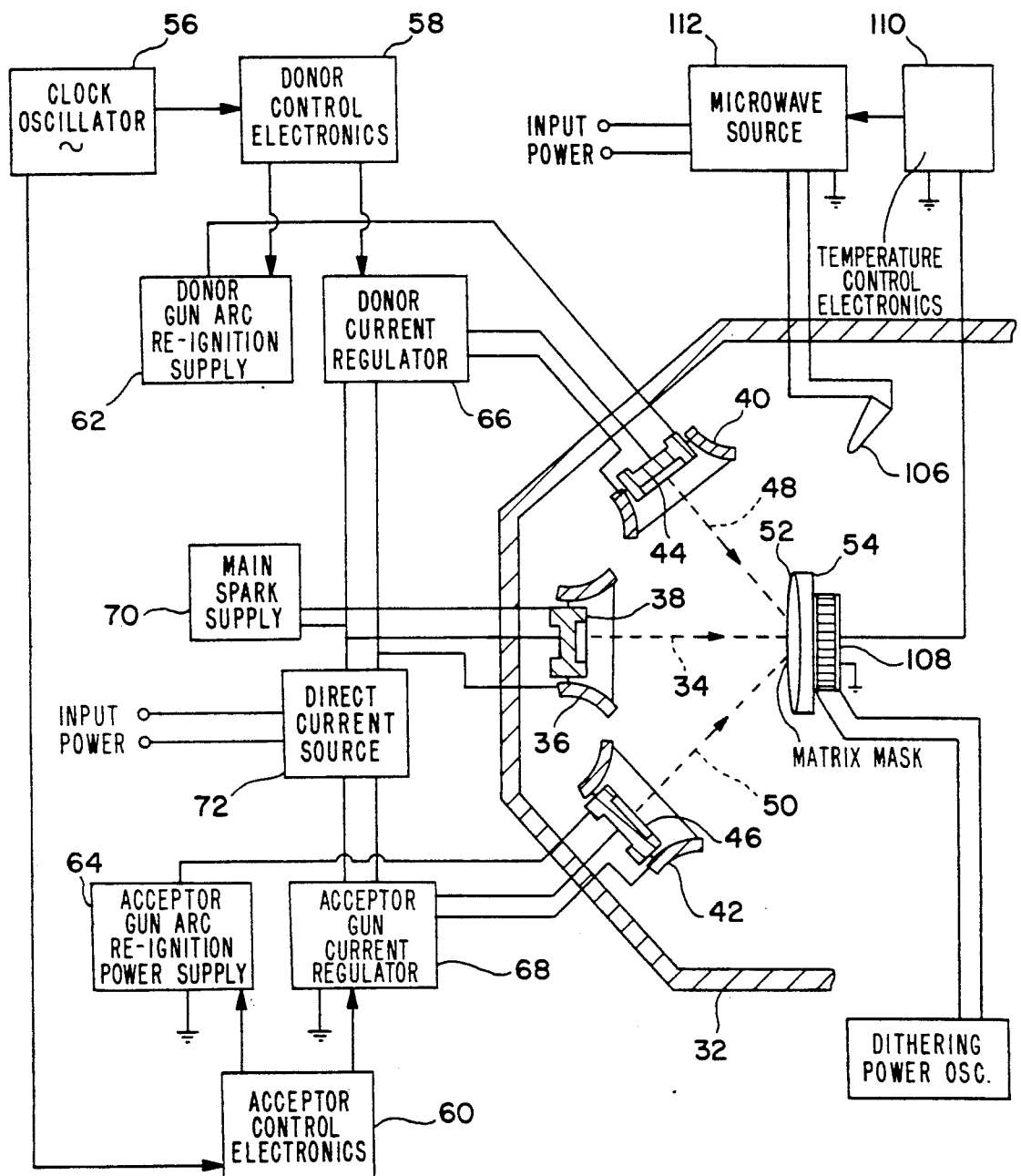
FIG. 2 is a semi-schematic diagram of a system for controlling deposition of material to produce diamond semiconductor devices.

A system for producing diamond-like semiconductor devices is illustrated in FIG. 2. The advantages of arc deposition processes such as those illustrated in FIG. 2 is that they can force mixing of otherwise imiscible substances to provide hitherto unknown alloys. This characteristic makes the arc deposition process ideally suited to laying down films of doped carbon crystals upon a doped substrate, and providing films of pure, cubical sp3 carbon for insulation where desired.

The system shown in FIG. 2 is comprised of a vacuum chamber 32 having a main beam 34 produced by a main plasma arc gun 36. The main carbon beam 34 is generated in a manner similar to those described in the patents referenced hereinabove by provision of pure carbon electrode 38 in the main beam gun 36.

Doping is provided by donor plasma arc gun 40 and acceptor arc gun 42. Donor gun 40 has pentavalent donor material 44 while acceptor gun 42 has trivalent acceptor material 46. Donor gun 40 and acceptor gun 46 produce donor beam 48 and acceptor beam 50 respectively which impinge upon substrate 52 mounted on holder 54.

The main beam gun 36, donor gun 40, and acceptor gun 42 are all independently operated by electronics as will be described in greater detail hereinafter. Since arc current can not be directly controlled, such control is provided by varying the time duration of pulses of direct current applied to the plasma arc guns. This is accomplished electronically by a process started (and restarted) at each pulse of current to the plasma arc guns. Clock oscillator 56 provides a gated output to donor control electronics 58, donor gun re-ignition supply 62 and donor control regulator 66 to operate donor gun 40. A similar circuit comprised of acceptor control electronics 60, acceptor re-ignition power supply 64 and acceptor current regulator 68 operate acceptor gun 42. Power is supplied to donor current regulator 66, acceptor current regulator 68 and main spark supply 70 by direct current source 72.

Figure 3:
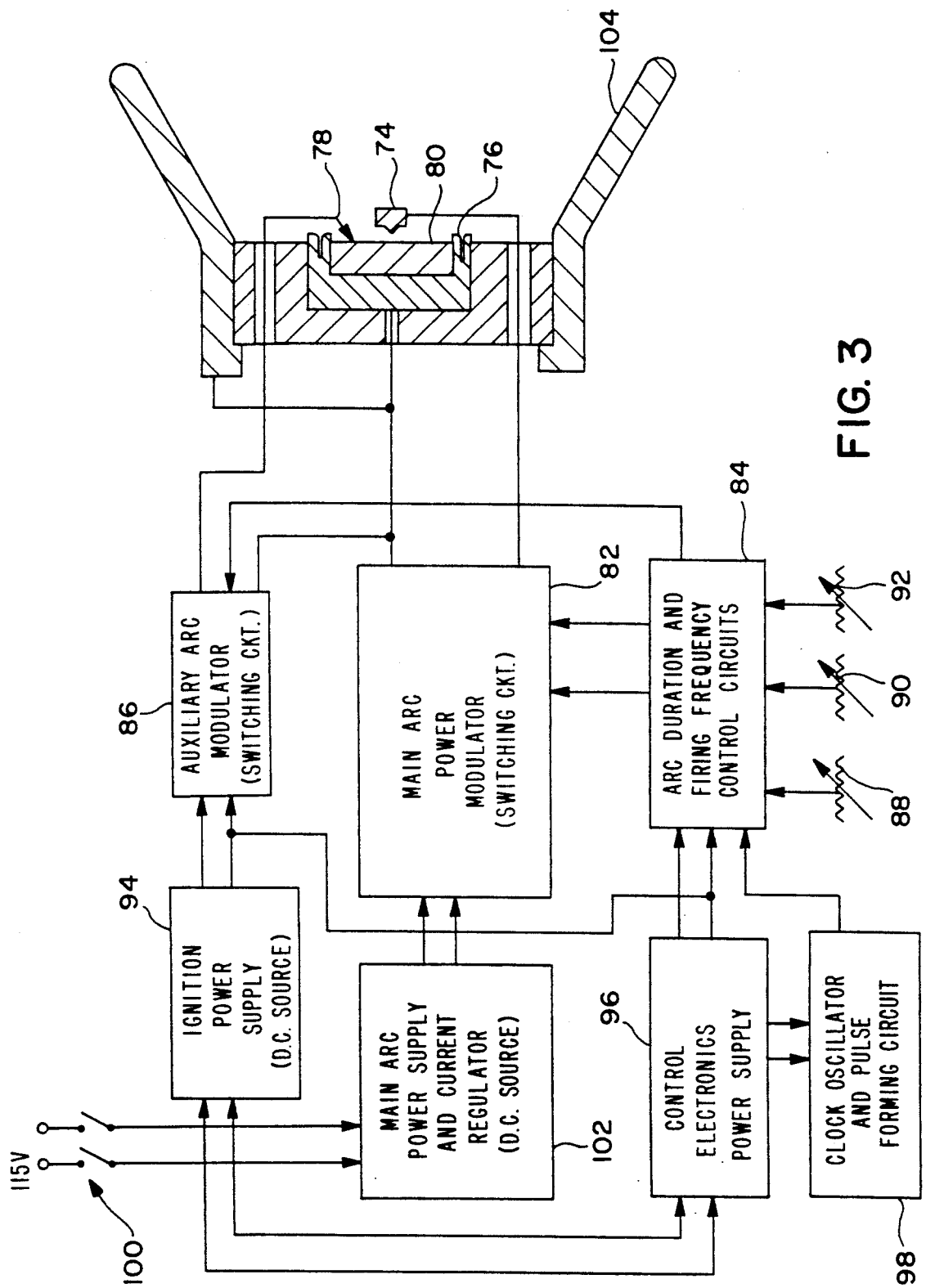
FIG. 3 is a schematic block diagram of a physical circuit for varying the time duration of the pulses directly applied to the main donor, or acceptor plasma arc guns.

A typical plasma-arc-gun ion beam control electronic circuit used by the three separately controlled plasma-arc guns is illustrated in FIG. 3 which shows the main functions required to control each of the plasma arc guns. Arc electrodes 74, 76 and 78 are made of a material that it is desired to deposit. This would be pure carbon for the main ion beam gun 36, and carbon combined with the chosen dopant materials for the donor gun 40 and acceptor gun 42. Precise control of the material being deposited as a function of time is provided by pulsing the arc of each plasma-arc gun as needed, in response to external controls; these external controls can be either manual, or under control of a computer program for repetitive production of identical semiconductor devices.

The plasma arc gun design can be similar to the various designs mentioned in the basic patents of A.A. Snaper mentioned hereinabove and incorporated by reference. FIG. 3 is a schematic block diagram and sketch of such a plasma-arc gun. An auxiliary ignitor electrode 78 is used to initiate the arc for each pulse; it is made of the same material that is used for the source electrode material of electrodes 74, 76 and 80. Once the arc is initiated, main arc electrode 74 continues the arc for the duration of a single-pulse, as long as the main arc power modulator 82 has arc power switched "on". When the arc duration and firing frequency control circuit 84 calls for an end to the pulse by sending an "off" signal, then, the arc power switches off and the arc is extinguished. The next pulse is started by sending an "on" signal to both the main arc power modulator 82 and auxiliary arc modulator 86 at the same time. The duration of "on" times and "off" times are set by potentiometer controls 88 and 90, respectively. The pulse repetition rate is set by potentiometer control 92. There are limits to the "on" and "off" times as a result of pulse repetition rate, and the limit to the pulse repetition rate as a function of the finite time required to initiate and extinguish the arc. In general, pulses of a few hundred milliseconds duration, with repetition rates in the neighborhood of 3 or 4 per second to 3 to 4 per minute are achievable.

Ignition power supply 94 is a "DC" source for auxiliary arc modulators 86. Control electronics power supply 96 is used for clock oscillator 98 and arc duration and firing frequency control circuits 84. Each plasma arc gun has a separate arc power on/off switch applying power through main power supply 102 so that one or more guns can be made active at a time, whenever they are required. The plasma-arc ion beam control subsystem is substantially identical for all of the guns. Beam forming "lens" electrode 104 requires some empirical design work and is represented in FIG. 3 as sort of a flared horn.

When three guns as illustrated in FIG. 2 are used the various control parameters can be coupled to a process control computer that will run its program repetitiously in order to produce identical device films.

One key to producing proper crystallization of carbon on a substrate is the temperature of the substrate. In FIG. 2 the temperature control means is in the form of microwave energy beamed directed at target substrate holder 54 from microwave energy transmitting antenna 106. Temperature sensor 108 placed on the back of substrate holder 54, senses the temperature and relays this information to temperature control electronic package 110 which will be described in greater detail hereinafter. Temperature electronics 110 compares the temperature to a manually (or computer) preset value and issues appropriate turn on/turn off and power level switching orders to microwave source 112 that illuminates the target through antenna 106. Thus the loop is closed to provide precise temperature control of substrate 52. A temperature range in the neighborhood of 750 to 800 degrees Fahrenheit has been found most desirable to produce the proper crystallization of sp3 carbon.

Figure 4:
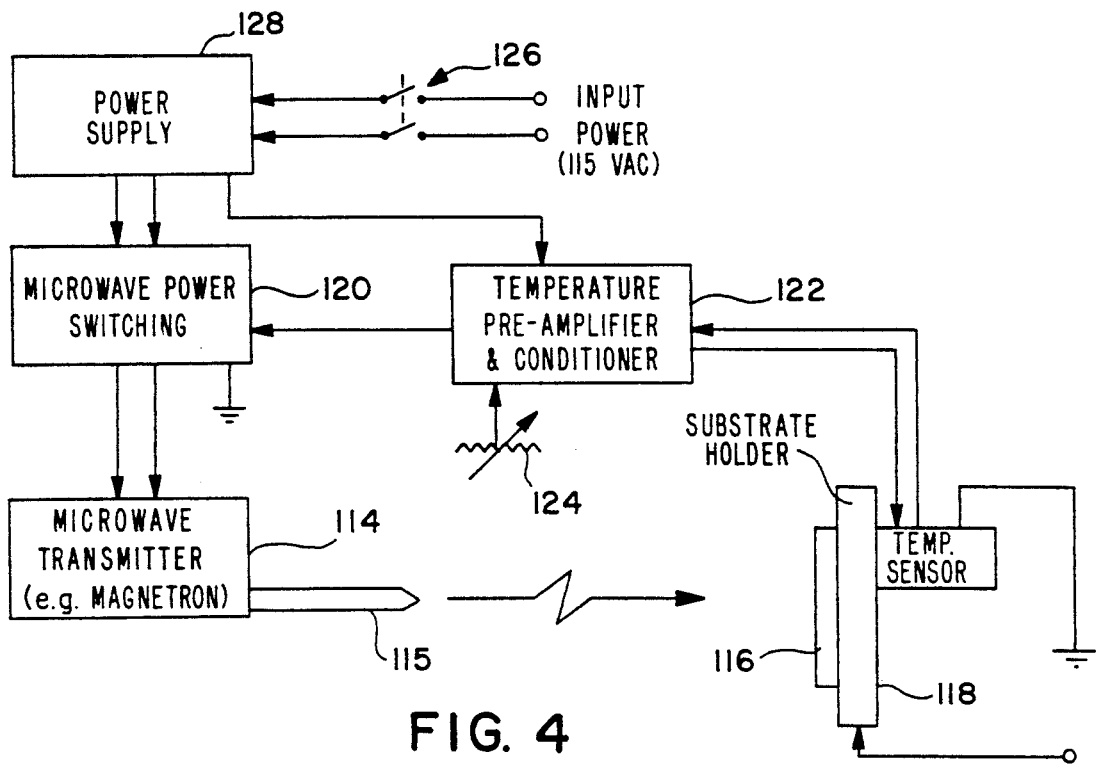
FIG. 4 is a schematic block diagram of a temperature control subsystem for the semiconductor deposition system.

The temperature control subsystem is shown in greater detail in FIG. 4 which shows how a microwave transmitter 114 beams energy to substrate 116 in vacuum chamber 32 (FIG. 2) and its holder 118 as a result of being switched on or off by power control microwave switching circuit 120 in response to a signal generated by temperature pre-amplifier and conditioner 122 from the dynamic difference between the preset voltage from control 124 and observed voltage (temperature generated) out of the temperature sensor mounted on the backside of the substrate holder 118. Input power is provided separately through switch 126, power supply 128 and microwave power switching 120. Microwave transmitter energy is beamed to substrate 116 from microwave antenna 115.

Figure 5:
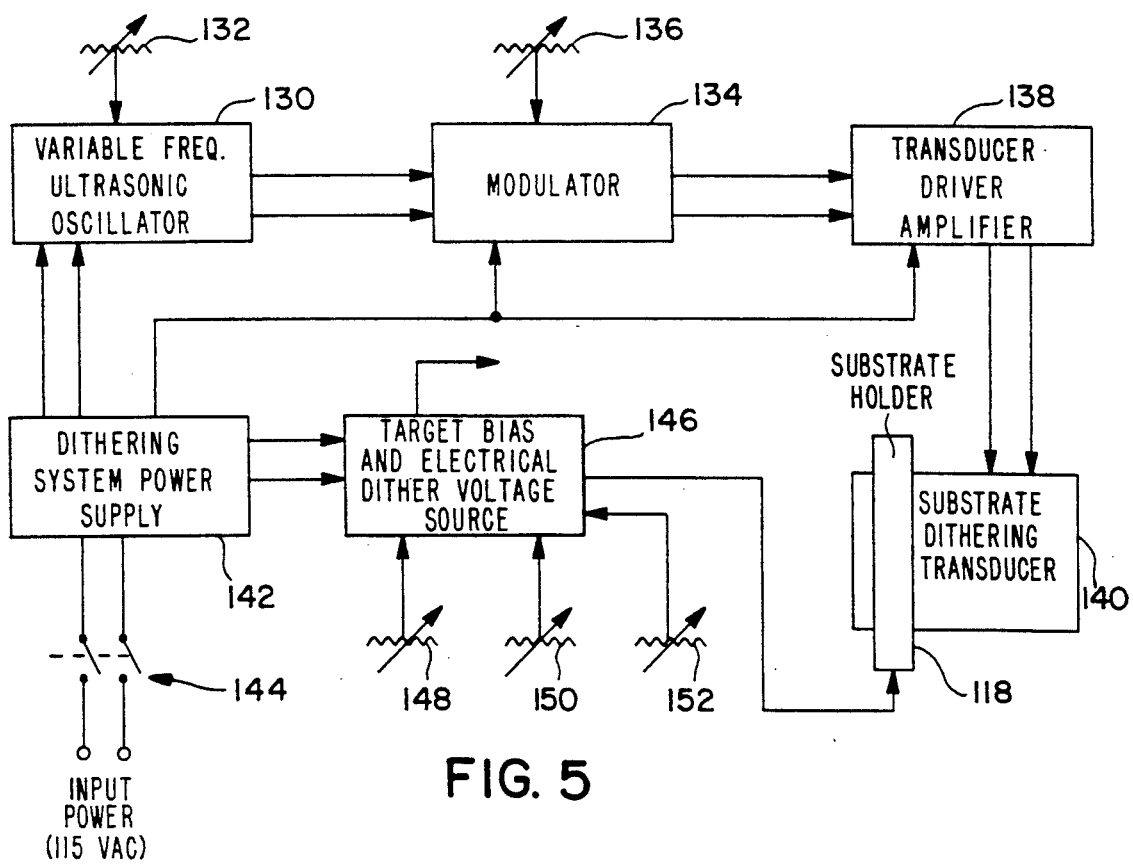
FIG. 5 is a schematic block diagram of a dithering subsystem for the semiconductor deposition system.

In the situation of the present invention where the auxiliary plasma-arc guns are used to inject dopant, smoother distribution and a more even flow into the diamond surface can be obtained by dithering the substrate holder at sonic or ultrasonic frequencies. A barium titanate slab or similar transducer, driven by a power oscillator can be used to perform the mechanical dithering as shown in greater detail in FIG. 5. This Figure illustrates how both ultrasonic (mechanical) dithering and electrical dithering (by superimposition of an alternating voltage upon the beam accelerating bias "DC voltage") can be applied. Variable frequency ultrasonic oscillator 130 has its frequency set by potentiometer control 132; the alternating voltage is fed to modulator 134 where the dithering amplitude is set by control 136 and fed to transducer driver amplifier 138 in order to drive substrate holder 118 back and forth as substrate transducer 140 expands and contracts with the applied ultrasonic drive power. Dithering subsystem power supply 142 provides energy for the entire subsystem, whenever the dithering power on/off switch 144 is "on". Electrical energy from power supply 142 is fed to target bias and electrical dither voltage source 146 where the "DC" bias can be set by potentiometer control 148.

Dithering "AC" frequency can be set by potentiometer control 150 and target dithering voltage "amplitude" can be set by potentiometer control 152. These values can be in the microwave range also. The combined DC bias sand superimposed AC dithering voltage are applied between ion gun source material and target to alternatively speed up and defocus the ION beam in order to provide a more uniform (smoother) deposit. Both types of dithering may be applied to substrate holder 118 separately or independently as the need arises.

Thus there has been disclosed a unique plasma arc deposition system for producing diamond, doped diamond or diamond-like coatings on a substrate by pulsed plasma technique. These techniques do not require or produce temperature rise at the substrate allowing normally temperature sensitive substrates to be utilized. Typical of substrates which bond readily to the thin film diamond coatings without degradation are zinc sulfide (ZnS) or zinc selenide (ZnSe), which are useful in infrared windows or laser components. They system disclosed and described can be used in the development of products and materials such as producing pn junction diodes of crystalline carbon, so that rectifiers able to withstand temperatures in the neighborhood of 1000 to 1500 degrees Fahrenheit can be manufactured. Junction transistors that can operate at temperatures around 1000 degrees Fahrenheit are also possible. Insulated gate field effect transistors that can handle high source to drain potentials and provide high gain without seriously loading the signal source, while operating at elevated temperatures beyond those achievable with silicon devices can be produced with the system described. Many other diamond-like integrated circuit chips, such as light emitting diodes or diodes used in solid state lasers are possible. Since thick diamond layers of good optical clarity can be produced by the process disclosed herein, among the new devices that have become possible is an optical modulator that depends upon the polarizing effects of electric fields upon light beams through the crystal lattice. This property leads to the entirely new family of high-power, opto-electronic coupling, modulating, scanning and/or sensing devices based upon diamond semiconductors. Many other semiconductor devices that can utilize the enhanced properties of diamond-like films can be produced with the invention disclosed and described herein.

This invention is not to be limited by the embodiment shown in the drawing and described in description, which is given by way of example and not of limitation, but only in accordance with the scope of appended claims.

What is claimed is:

1. Apparatus for producing semiconductor devices, comprising:
   a vacuum chamber;
   one or more plasma arc guns in said vacuum chamber;
   loading means for loading a substrate holder into said vacuum chamber;
   irradiating means for irradiating a substrate on said substrate holder with at least one plasma arc beam from said one or more plasma arc guns;
   pulse control means for applying precisely controlled time duration pulses to said one or more plasma-arc guns, said pulse control means comprising; start means for applying a start current to said one or more plasma-arc guns to strike an arc, pulse generating means applying current to said one or more plasma-arc guns to sustain said arc, clock oscillator means, a first register for starting pulses from said clock oscillator while current to said one or more plasma-arc guns is on, gate means gating pulses from said clock oscillator to said first register, a second register storing a preset pulse count representing a preselected time period when current to said one or more plasma-arc guns is on, first comparing means comparing the preset pulse count in said second register with the pulse count gated to said first register, stop pulse generating means generating a stop pulse to stop current to said one or more plasma-arc guns; a third register for storing pulses from said clock oscillator while current to said one or more plasma-arc guns is off, a fourth register storing a preset pulse count representing a preselected time period when current to said one or more plasma-arc guns is off, second comparing means for comparing the number of pulses stored in said fourth register with the number of pulses received by said third register; restart pulse generating means for restarting current to said one or more plasma-arc guns; whereby application of current to said one or more plasma-arc guns to supply material to said substrate is precisely controlled.

2. The apparatus according to claim 1 in which said plasma-arc guns comprise; a main beam plasma-arc gun, an acceptor beam plasma-arc gun and a donor beam plasma-arc gun; said pulse control means selectively and independently controlling operation of said main beam, acceptor, and donor plasma-arc guns.

3. The apparatus according to claim 1 including means for controlling the temperature of said substrate.

4. The apparatus according to claim 3 in which said temperature controlling means comprises; a microwave transmitting means; temperature sensing means sensing the temperature of said substrate; and microwave power switching means controlling the output power of said microwave transmitting means.

5. The apparatus according to claim 4 in which said temperature control means controls the temperature in the range of 750 to 800 degrees Fahrenheit.

6. The apparatus according to claim 1 including means for dithering said substrate to provide smoother distribution and even flow of material to said substrate.

7. The apparatus according to claim 6 in which said means for dithering said substrate includes means for applying both mechanical and electrical dithering.

8. The apparatus according to claim 7 in which said means for mechanically dithering said substrate comprises; a dithering transducer attached to said substrate; and means for applying dithering power to said substrate; and means for applying dithering power to said dithering transducer.

9. The apparatus according to claim 8 in which said means for applying dithering power to said dithering transducer comprise; variable frequency ultrasonic oscillator; modulating means connected to said variable frequency ultrasonic oscillator to control the dithering amplitude; and a driver amplifier receiving the output of said modulating means.

10. The apparatus according to claim 7 in which said means for applying electrical dithering comprises; means for applying an AC voltage superimposed on a target DC voltage to said substrate.

* * * * *